United States Patent
Fang et al.

[11] Patent Number: 5,965,270
[45] Date of Patent: Oct. 12, 1999

[54] METAL/AMORPHOUS MATERIAL/METAL ANTIFUSE STRUCTURE WITH A BARRIER ENHANCEMENT LAYER

[75] Inventors: Yeau-Kuen Fang, Tainan; Kuen-Hsien Lee, Taichung, both of Taiwan

[73] Assignee: National Science Council, Taipei, Taiwan

[21] Appl. No.: 08/684,416

[22] Filed: Jul. 19, 1996

[51] Int. Cl.$^6$ .................................................. H01L 23/12
[52] U.S. Cl. .............................. 428/446; 257/50; 257/77; 257/530; 428/469; 428/472; 428/698; 428/216
[58] Field of Search .................................... 428/469, 472, 428/698, 446, 216; 257/77, 50, 530

[56] References Cited

U.S. PATENT DOCUMENTS

| | | | |
|---|---|---|---|
| 4,980,307 | 12/1990 | Ito et al. ........................ | 148/DIG. 112 |
| 5,138,401 | 8/1992 | Yamazaki ..................................... | 357/5 |
| 5,252,515 | 10/1993 | Tsai et al. ................................. | 437/195 |
| 5,481,135 | 1/1996 | Chandra et al. ........................ | 257/701 |

*Primary Examiner*—Archene Turner
*Attorney, Agent, or Firm*—Chi-Pin Chang

[57] ABSTRACT

An amorphous-silicone-based antifuse structure has been invented for VLSI (Very Large Scale Integration circuits) FPGA's (Fields Programmable Gate Array) applications. The structure comprises from top to bottom a first Al layer/a first i-a-SiC:H layer/an i-a-SiH layer/a second i-a-SiC:H layer/a second Al layer, which is basically a MIM (Metal/Insulator/Metal) structure. The MIM structure offers such major advantages as simple for preparation and low in cost. Due to use of the Al layer as an electrode metal and use of a PECVD system for the preparation of the amorphous silicon materials, the antifuse structure is compatible with that of general VLSI devices. In addition, due to a difference in the thickness of barrier enhancement layers in the first and the second i-a-SiC:H layer, a programmed voltage can be adjusted easily and applied in many fields. This structure has a very low on-resistance as the antifuse structure breakdown. The anitifuse has a high resistance (i.e. OFF state) under an unprogrammable state and its leakage current under 5V bias is smaller than 100 nA.

6 Claims, 11 Drawing Sheets

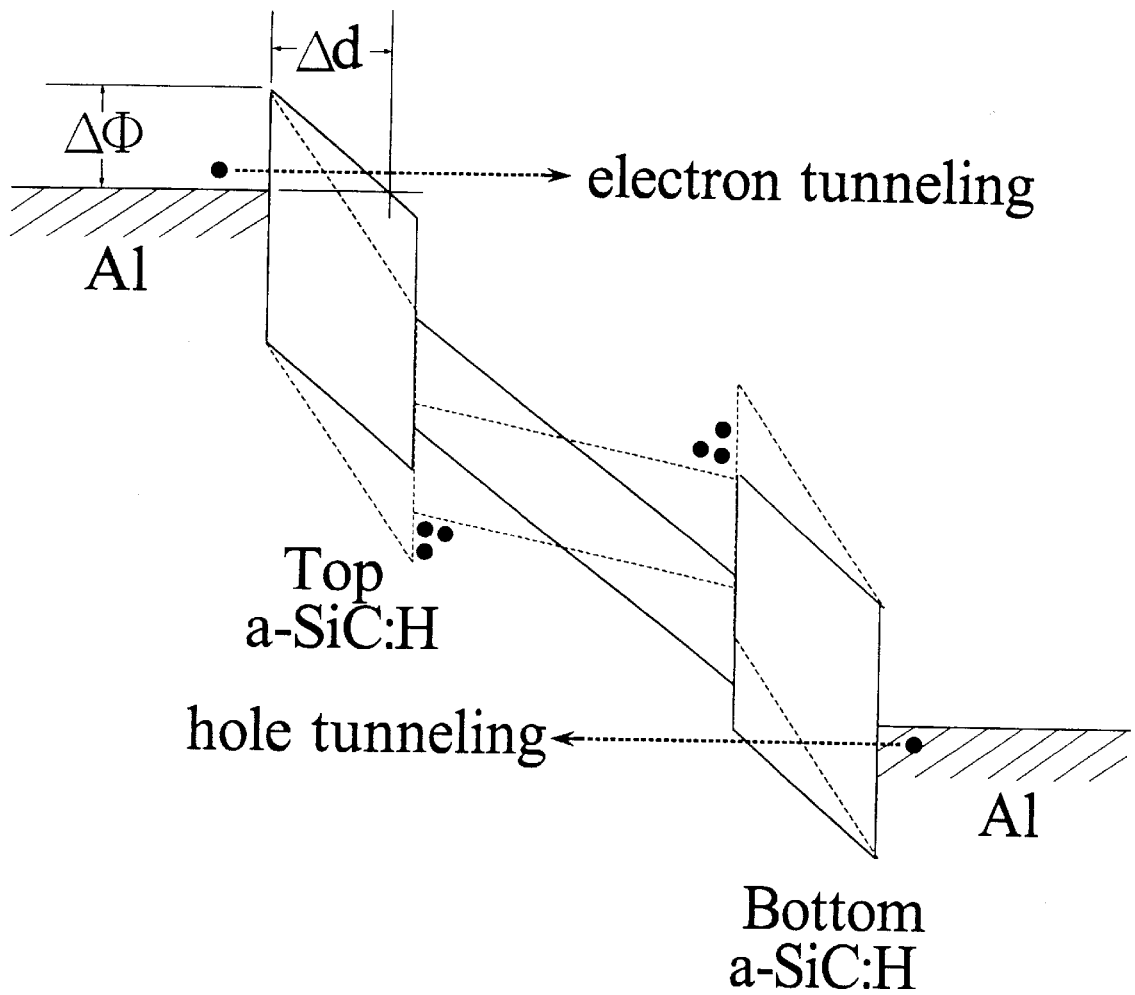
FIG2.A

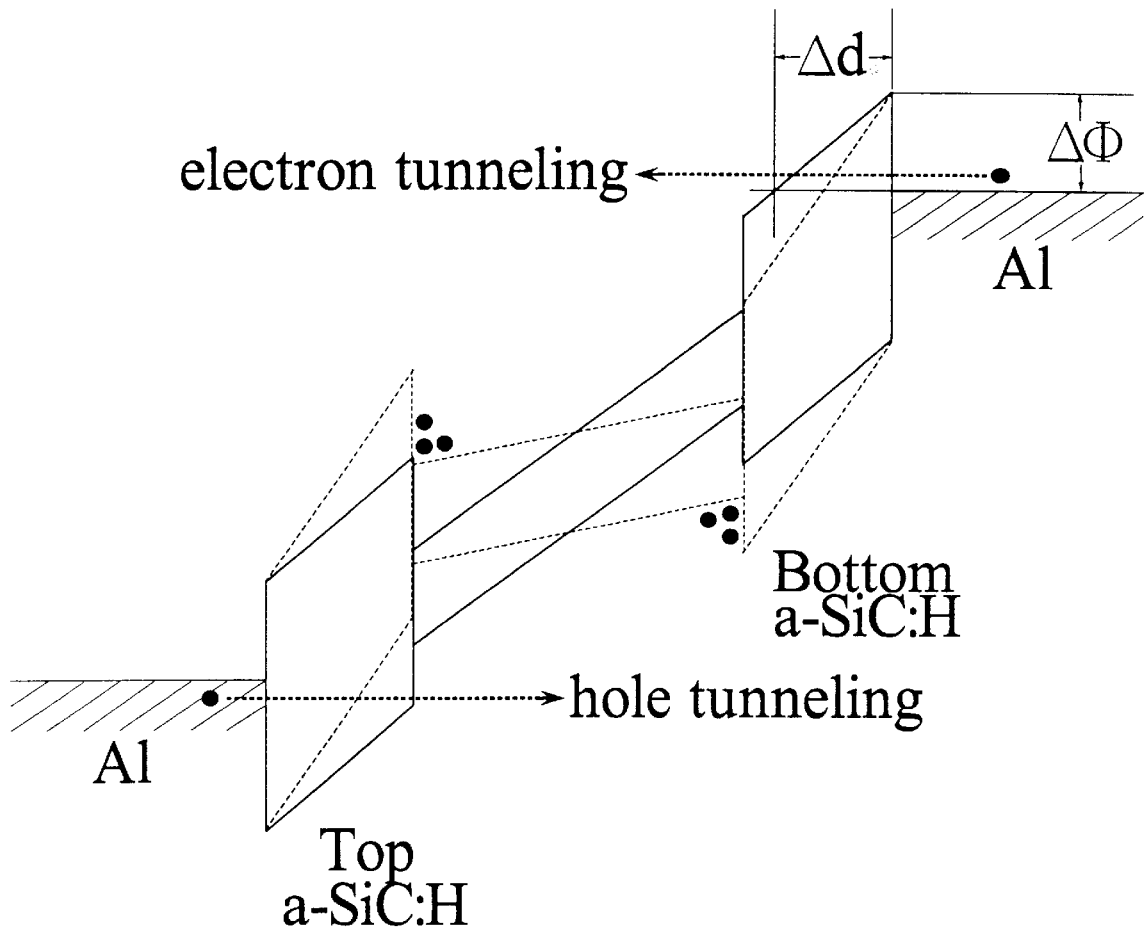
FIG2.B

METAL/AMORPHOUS MATERIAL/METAL ANTIFUSE STRUCTURE WITH A BARRIER ENHANCEMENT LAYER

FIELD OF THE INVENTION

This invention relates to a novel Metal/Amorphous material/Metal antifuse structure.

BACKGROUND OF THE INVENTION

The use of high resistance materials in the preparation of antifuse structures have been extensively studied in recent years. These studies have indicated that the addition of compounds such as silicon dioxide, silicon nitride or dielectric materials, i.e. nitride/oxide dielectric, polysilicon, to the preparation of antifuse structures resulted in a successful development in application to FPGA's (see Y. Shacham-Diamand, IEEE Trans. Electron Devices, 1993, vol. 40, p. 1780) These antifuses offer significant improvement, such as on-resistance, programmed voltage or other characteristics compared with other programmable elements (A. E. Gamal et.al. reported in IEEE J. Solid-State Circuits, 1989, vol. 2 4, p. 3 94).

Despite the success of such antifuse structures, however, some problems still remained. These problems include: 1) high temperature in dielectric preparations resulting in steam oxidation; 2) on-resistance levels that are not low enough (>50Ω); 3) insufficiently gathered distribution; and 4) unadjustable forward reverse voltages.

These problems have effectively limited the use of dielectric-based antifuse structures to very large integrations of FGPA. In addition, current indications are that the metal used in MIM structures based on nitride/oxide/nitride insulators are incompatible with VLSI processes.

SUMMARY OF THE INVENTION

In this invention, a thin i-a-SiC:H layer is deposited on an Al/i-a-Si:H and an i-a-Si:H/Al layer which is a MIM (Metal/Insulator/Metal) antifuse structure interfaces separately as a barrier enhancement layer. Because of its high-energy bandcap, the barrier enhancement layer acts to suppress a leakage current and increase a breakdown voltage. In addition, because the thickness of the i-a-SiC:H layer is adjustable, a required programming voltage can be selected, thereby increasing the efficiency of the application. In other words, use of a-Si materials in the preparation is cost effective and applicable to Fields Programmable Gate Array ("FPGA") in the Very Large Scale Integration circuits ("VLSI") process.

The invention utilizes an a-Si material in the preparation of the antifuse. Its high resistance, simple preparation and low cost make the i-a-Si:H material attractive as an insulator. In addition, after breakdown, the i-a-Si:H material can react with an Al to form a low resistance Al/Si eutectic alloy. In order to prevent a spiking effect of the Al, an i-a-SiC:H material acts as a barrier enhancement layer. The high energy bandcap of the i-a-SiC aids in the prevention of the Al spiking, low leakage current and high voltage breakdown. The i-a-SiC material also offers simple preparation and low cost. The preparation process of the i-a-SiC:H is also compatible with that of the i-a-Si:H material, thereby reducing the complexity of the procedures involved. Furthermore, the Al is adopted as an used metal layer in an interface of the i-a-Si:H material and the MIM antifuse structure, which is widely used in VLSI applications.

In addition, due to the difference in thickness between the top and bottom layers of the antifuse structure provided by the invention, the forward and reverse programming voltages can be adjusted separately, thereby extending its application. Furthermore, because the thickness of the i-a-SiC:H layer can be adjusted, it is possible to select the required programming voltages, thereby increasing the expedience in the application.

In this invention, the antifuse structure herein provided comprises a MIM with a top to bottom structure arranged in the following sequences: Al/i-a-SiC:H/i-a-Si:H/i-a-SiC:W/Al. A major advantage of the MIM structure is that only a small portion of the structure is involved in a tunneling breakdown between the programming process. The on-resistance, therefore, will not be influenced by the structure area. This characteristic makes it suitable for submicron device processes.

In addition, the i-a-Si:H material can react with the Al to form a low resistance Al/Si eutectic alloy after its structure breakdown. Due to the addition of the i-a-SiC:H to the interface of the Al/i-a-Si:H, the i-a-SiC:H acts as a barrier enhancement layer because of its high-energy bandgap which contributes to the prevention of Al spiking, low leakage current, high breakdown voltage. In addition, the preparation involves a simple process that is cost effective. Furthermore, the preparation process is compatible with that of the i-a-Si:H material, thereby reducing the complexity of the process. As shown in FIG. 1, the present invention provides a new MIM antifuse structure possessing a low on-resistance and low leakage current. The Al/i-a- SiC:H/i-a-Si:H/i-a-SiC:H/Al antifuse structure is predeposited on a silicon substrate; the insulation between the structures is achieved with a field oxide layer. The i-a-Si:H material is selected as the main insulation material. Since the i-a-Si:H material reacts with the Al to form a low resistance Al/Si eutectic alloy as the antifuse structure breakdowns, the antifuse structure therefore has the advantage of a low on-resistance. Since the amorphous silicon materials are prepared by a PECVD system, this process further has an advantage of being performed under a low temperature (250° C.).

Due to the statistical fluctuation in thickness of the insulating layer on the metal substrate, at the beginning of the on-programming in the MIM structure, the breakdown generally originates from the thinnest portion in the insulation layer. After the breakdown occurs, the thinnest parts form a short circuit and almost all breakdown currents pass through this shortening path, thereby limiting the extension of the breakdown area. During this time the antifuse structure will convert from a high resistance state to a low resistance state.

S. M. Sze disclosed many theories explaining the breakdown of the insulation layer. However, the breakdown theory existing in the antifuse structure of this invention is mainly caused by the low thickness of the i-a-SiC:H layer. The tunneling breakdown current is therefore independent of the operation temperature and the breakdown voltage decreases with an increase in the operation temperature.

The antifuse system according to the present invention reveals a high resistance (i.e. OFF state) under an unprogrammable state. In general, the operation voltage in the antifuse system is approximately 5 volts, at this point, the carriers inject into the i-a-Si:H layer by means of a field emission or thermal emission from both ends of a metal (Al) electrode. The result is illustrated in FIG. 2a and 2b. Due to the addition of the i-a-SiC: H barrier layer (i.e., which is a high energy bandgap) to the i-a-Si:H/Al layer of the antiface system, it effectively prevents ejection via either the field emission or thermal emission from the both ends of the Al electrode by formation of a high Al/i-a-SiC:H Schottky barrier to decrease the leakage current.

During the antifuse programming, the bias is increased to a high voltage (generally greater than 14 V). Under this high field, a band structure will become deeply inclined, thereby reducing an effective tunneling thickness, $\Delta d$, of the i-a-SiC:H layer and promoting carriers tunneling. A large number of tunneled carriers accumulate at top and bottom interfaces of the i-a-SiC:H/i-a-Si:H layer. The effective tunneling thickness, $\Delta d$, of the i-a-SiC:H layer will be further reduced due to the influence of the accumulated carriers, as illustrated in FIG. 2a and 2b by dashed lines, since the field across both the i-a-SiC:H layers has been enhanced by the accumulated carriers. This regenerative tunneling and reduction of the $\Delta d$ causes a rapid and continuous increase in the current up to the breakdown current and the programming current according to the present invention.

As the antifuse breaks down, a joule heating generated by the large current causes a diffused Al and the i-a-Si:H layer to form the eutectic alloy, thereby linking the antifuse. A large preset programming current causes a higher joule heating thereby enhancing the diffusion of the Al to form the Al/Si alloy with the i-a-Si:H layer. As a result, the on-resistance of the antifuse is decreased for the higher programming current. Therefore, when the programming current is high enough to enable the Al and the i-a-Si-:H to form the eutectic alloy, the lowest on-resistance is obtained and the antifuse structure reveals the low resistance state (ON state).

The antifuse structure according to the present invention was prepared on a Si substrate with a thick field oxide predeposited at first and then loaded into an evaporator after a cleaning step. The Al is deposited as the bottom layer metal by a thermal evaporation. The treated Si is then loaded into the PECVD system followed by sequential deposition of the i-a-SiC:H/i-a-Si:H/i-a-SiC:H layers by the same PECVD system. The structure constituents and thickness of the antifuse structure provided by the invention are shown in FIG. 1, the thickness of the i-a-SiC:H is 50–100 A and the thickness of the i-a-Si:H is 1000–2000A.

According to the preparation method described above, the low on-resistance antifuse structure comprises the substrate, the oxide layer, the Al layers, the barrier enhancement layers and the insulation layer. A $SiO_2$ material is used as the field oxide layer and the i-a-Si:H is the insulation layer. The barrier enhancement layer can be prepared either from the i-a-SiC:H or an i-a-$Si_3N_4$:H. The substrate can be selected from either of an undoped intrinsic silicon wafer, a n-type silicon wafer or a p-type silicon wafer. It should be noted that, however, the layer numbers of the substrate, the oxidation layer, the Al layer, the barrier enhancement layer, and the insulation layer as well as the arrangement of which in the low on-resistance antifuse structure are not limited in this invention. Essentially, the sequential arrangement of the material layers of a grown structure of the antifuse provided by the invention from top to bottom can be described as the Al layer-the barrier enhancement layer-the insulation layer-the barrier enhancement layer-the Al layer-the oxide layer-the substrate.

A RF (Radiant-Frequency) power, substrate temperature and total pressure of each layer in a grown structure are dependent on the AM structures. In this invention the RF power, substrate temperature and total pressure used in deposition of the i-a-Si:H layer are 50 Watt, 250° C. and 1 torr respectively. For deposition of the i-a-SiC:H layers, the RF power, substrate temperature and total pressure are 40 Watt, 250° C. and 1 torr, respectively. The gases used are $SiH_4$(25% in $H_2$) and $SiH_4$(25% in $H_2$)+$CH_4$(100%). The Al plate was deposited by thermal evaporation. The thickness of each layer was estimated and controlled by a growth rate, which is 60 Å/min. for the i-a-Si:H deposition and 50 Å/min. for the i-a-SiC:H deposition under the conditions described above. Finally, the temporarily grown yet unfinished structure is loaded into the evaporator again, the Al is deposited on the top surface of the unfinished structure by thermal evaporation as the top metal layer. The area of the used metal electrodes area are from 3 $\mu$m×3 $\mu$m to 100 $\mu$m×100 $\mu$m separately in this experiment. The i-a-Si:H can be 100 Å and the i-a-SiC:H can be 2000 Å. The thickness of each layer is controlled by the deposition rate, herein, the deposition rate for the i-a-SiC:H is 50 Å/min. and that for the i-a-Si:H is 60 Å/min. In order to further depict the details of this invention, a grown a-Si antifuse structure is expressed as a typical example.

BRIEF DESCRIPTION OF THE DRAWINGS

FIG. 2 shows an energy band diagram of the amorphous antifuse structure in which (a) is under a forward bias wherein the numerals having the following designation: (1) electronic tunneling; (2) top end; (3) penetration hole; (4) bottom end; and b) is under a reverse bias wherein the numerals having the following designation: (1) electronic tunneling; (2) bottom end; (3) penetration hole; and (4) top end.

DETAILED DESCRIPTION OF THE PREFERRED EMBODIMENTS

Figure 1:
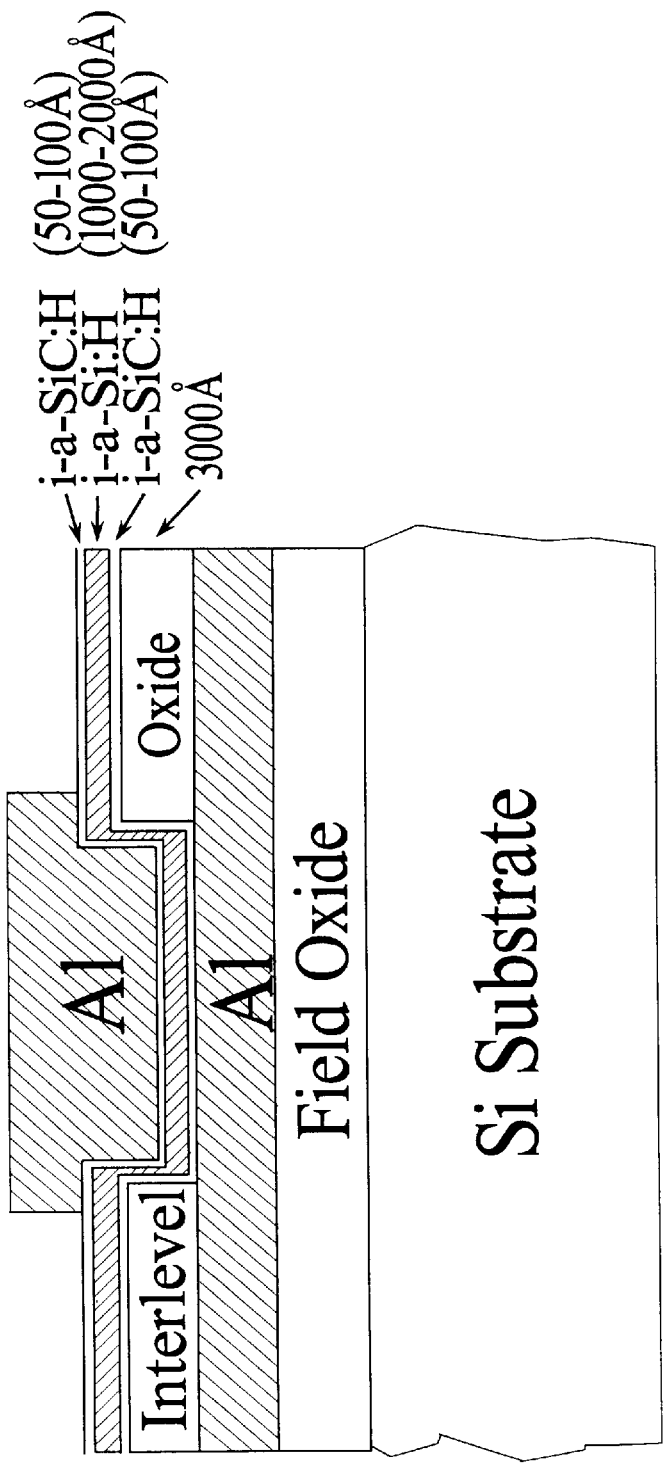
FIG. 1 illustrates a schematic cross section of the an amorphous antifuse structurem wherein each of the numerals having the following designation: (1) Al; (2) i-a-SiC:H (50–100 Å); (3) i-a-Si:H (1000–2000 Å); (4) i-a-SiC:H (50–100 Å); (5) 3000 Å; (6) the barrier enhancement layer; (7) the oxide layer; and (8) the substrate.
Figure 3A:
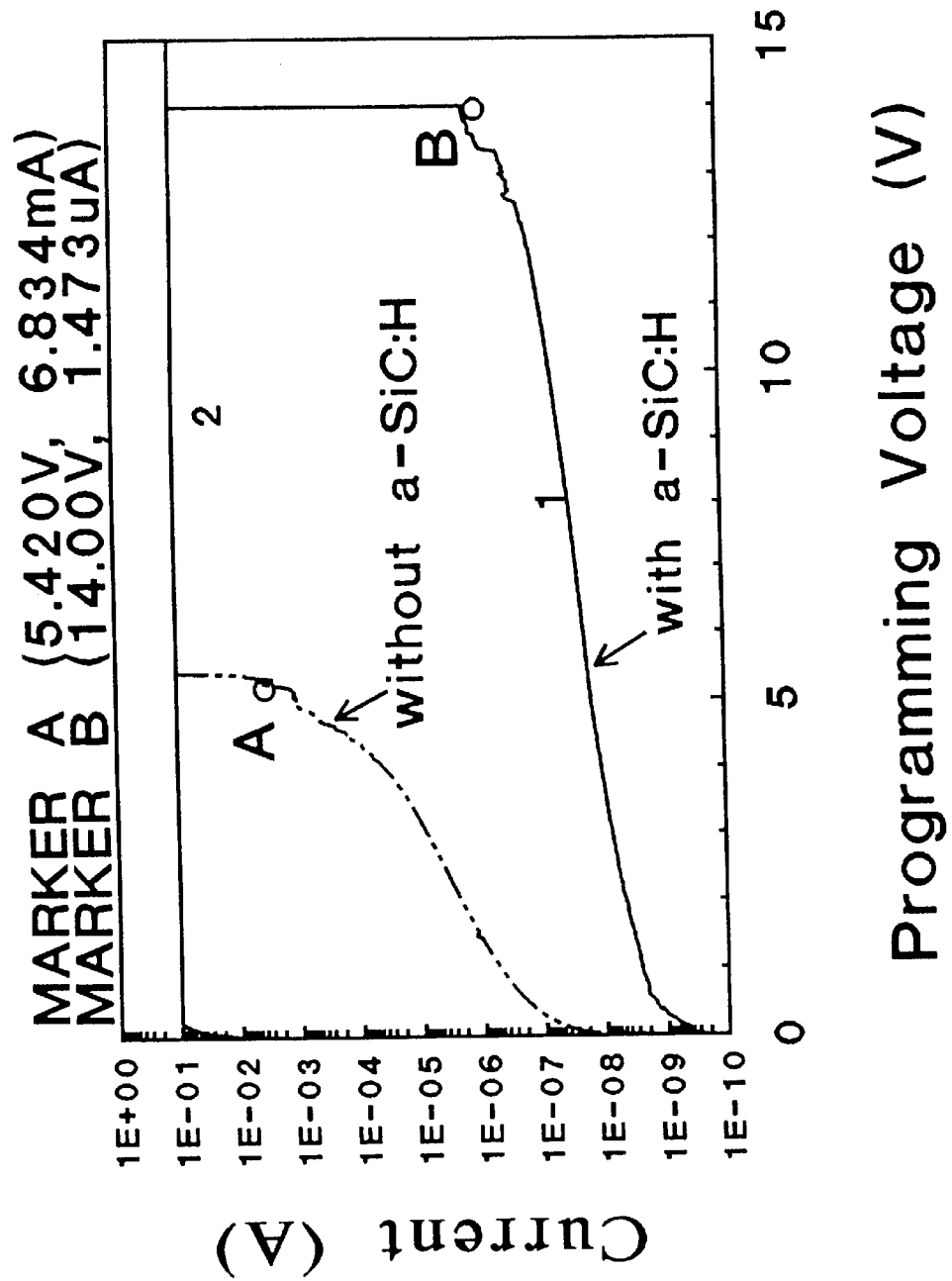
FIG. 3 shows a typical measured I/V characteristics of the new antifuse structure under both (a) forward bias and (b) reverse bias wherein (1) solid line: with 100 Å i-a-SiC:H layer at room temperature; (2) dashed line:without 100 Å i-a-SiC:H layer at room temperature.
Figure 3B:
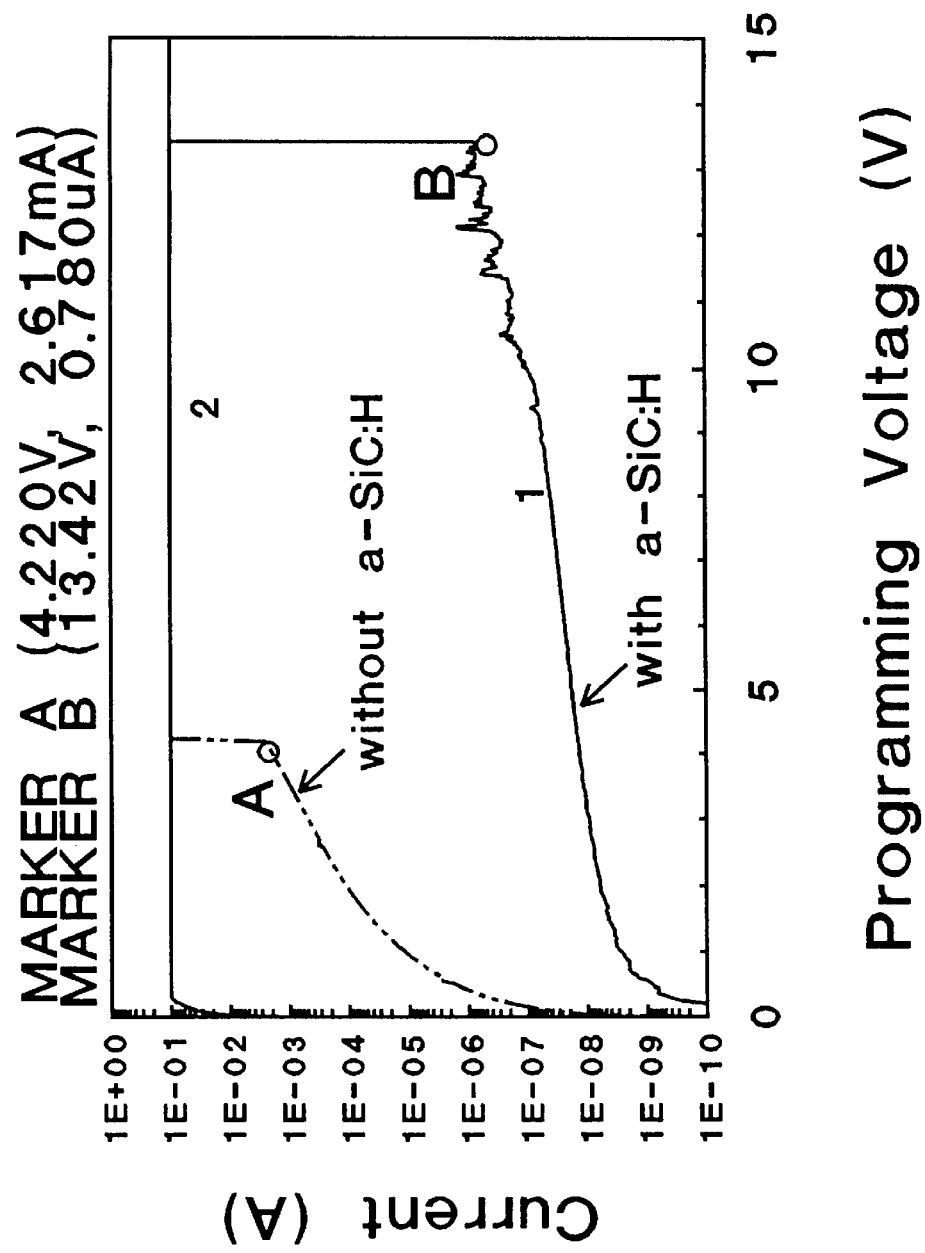

Referring to FIG. 3, current/voltage curves of the antifuse structure under (a) forward bias and (b) reverse bias conditions are illustrated. The dashed line represents an UV curve of the antifuse structure without the i-a-SiC: H barrier enhancement layer; but the solid line represents the I/V curve of the antifuse structure with the i-a-SiC:H barrier enhancement layer. From the comparison of these two curves, the antifuse structure with the i-a-SiC:H barrier enhancement layer provided by this invention possesses the function of decreasing the leakage current and increasing the breakdown voltage. In this figure, line 1 and line 2 represent the I/V curves of the antifuse structure before and after breakdown, respectively. The circle in line I indicates the breakdown voltage and current. As shown in line 2, under any bias, the current is limited by the preset value (100 mA) for protecting the measuring instrument. Furthermore, the results demonstrated that the antifuse has been conducted on the low resistance Al/Si and the Al metal has penetrated into the i-a-Si:H layer to form an eutectic alloy.

Figure 4A:
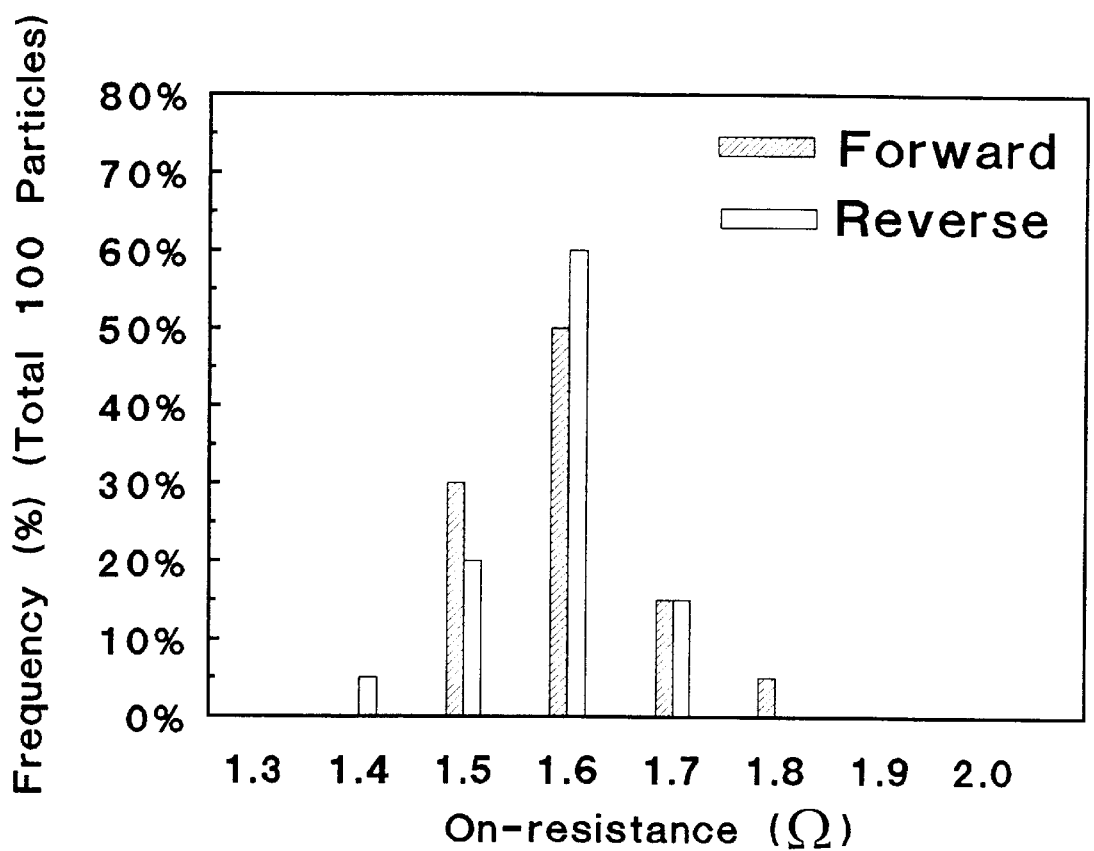
FIG. 4 is a histogram of the amorphous antifuse structure in which (a) is with the 100 Å I-a-SiC:H barrier enhancement layer and (b) is without the 100 Å i-a-SiC:H barrier enhancementlayer wherein (1) is under forward bias and (2) is under reverse bias. The programming current is 50 A, the size of the device was 5 $\mu$m×5 $\mu$m with the 1000 Å I-a-Si:H layer.
Figure 4B:
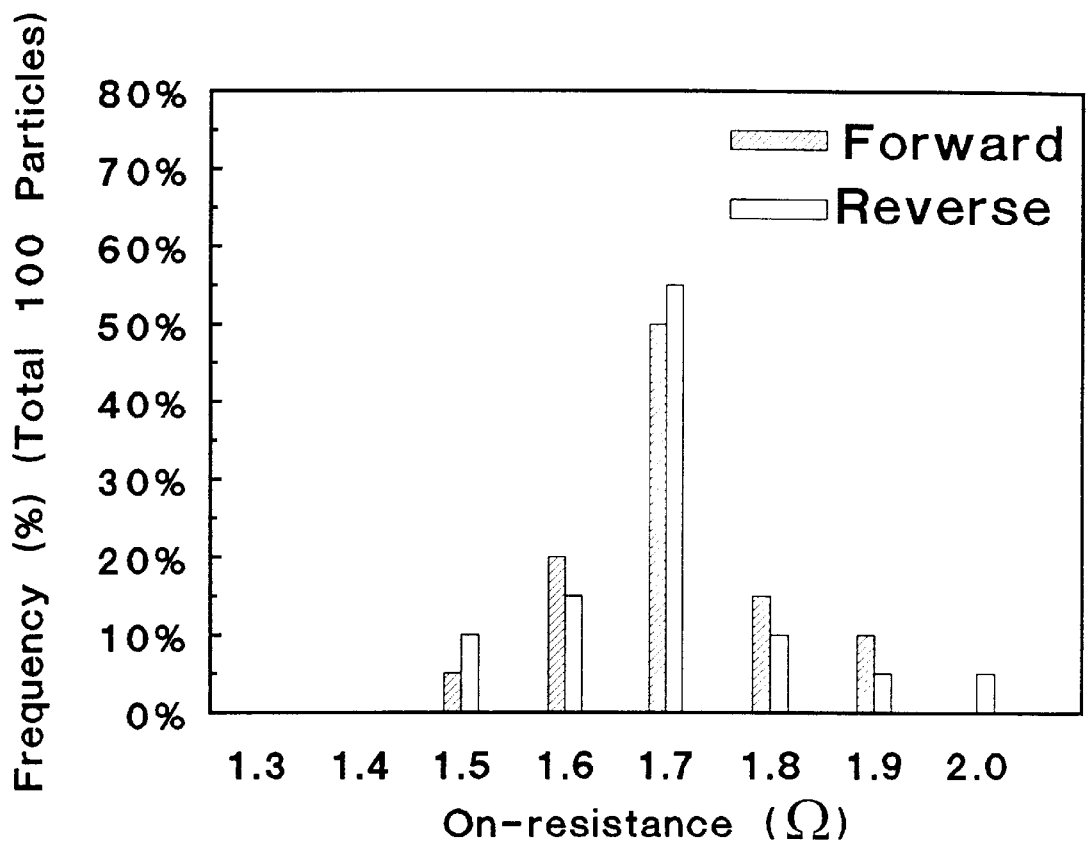

FIG. 4 illustrates the distribution of the on-resistance respectively with or without the i-a-SiC:H layer. Both types of the antifuse structure have similar distributions, FIG. 4(*a*) is a curve including the i-a-SiC:H layer; and FIG. 4(*b*) is a curve excluding the i-a-SiC:H layer. It should be noted that in FIG. 4(*a*), the on-resistance of either the forward or reverse bias is concentrated at 1.4Ω–1.8Ω, the high concentration in the statistical distribution represents the high reliability of the on-resistance of the antifuse and may be important in actual applications. Furthermore, a similar phenomena has been observed in FIG. 4 (*b*); these results reveal that the i-a-SiC:H barrier enhancement layer will not affect the formation of the Al/Si eutectic alloy.

Figure 5:
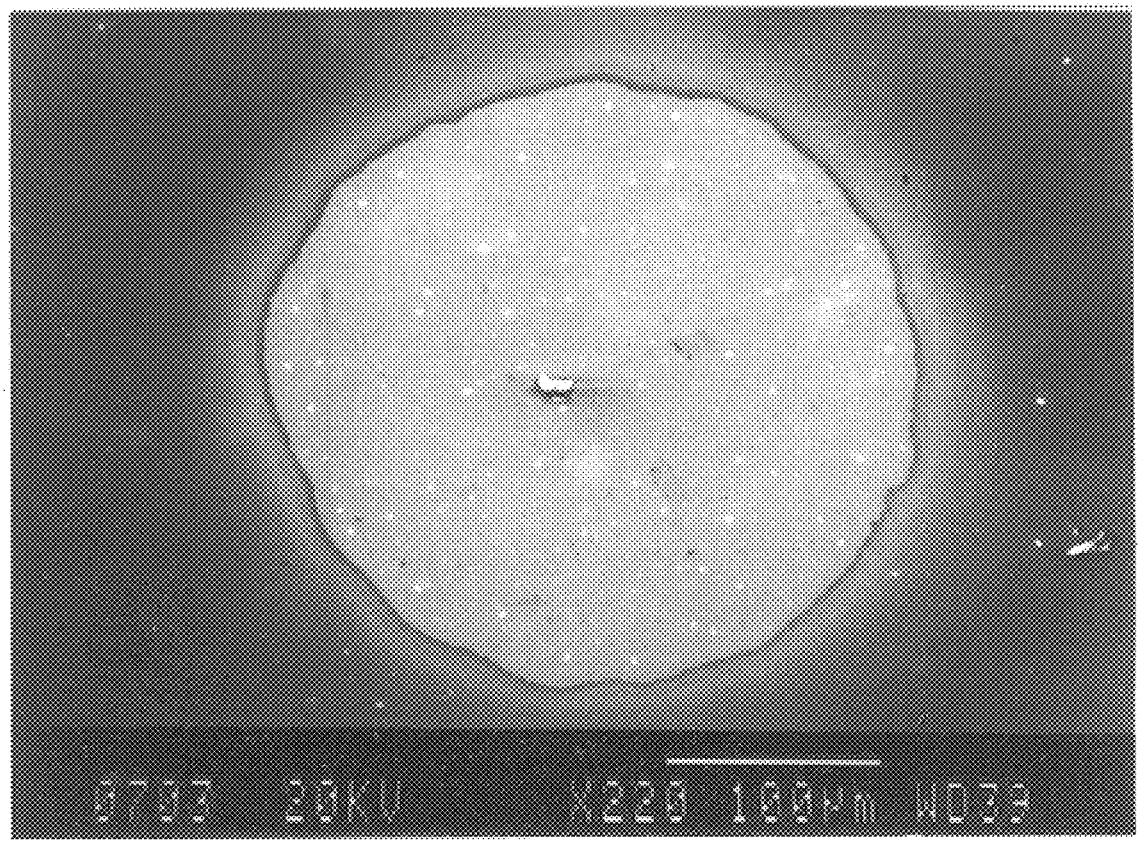
FIG. 5 shows the SEM micrograph of the surface of the amorphous antifuse structure after breakdown.

FIG. 5 illustrates a top view of the Scanning Electron Microscopy (SEM) of the antifuse structure after breakdown. The results showed that only a partial penetration of the Al into the i-a-Si:H layer to form the Al/Si eutectic alloy and the on-resistance is independent of the electrode area; the antifuse provided by the invention is therefore applicable to a process suitable for sub-micron size process.

Figure 6:
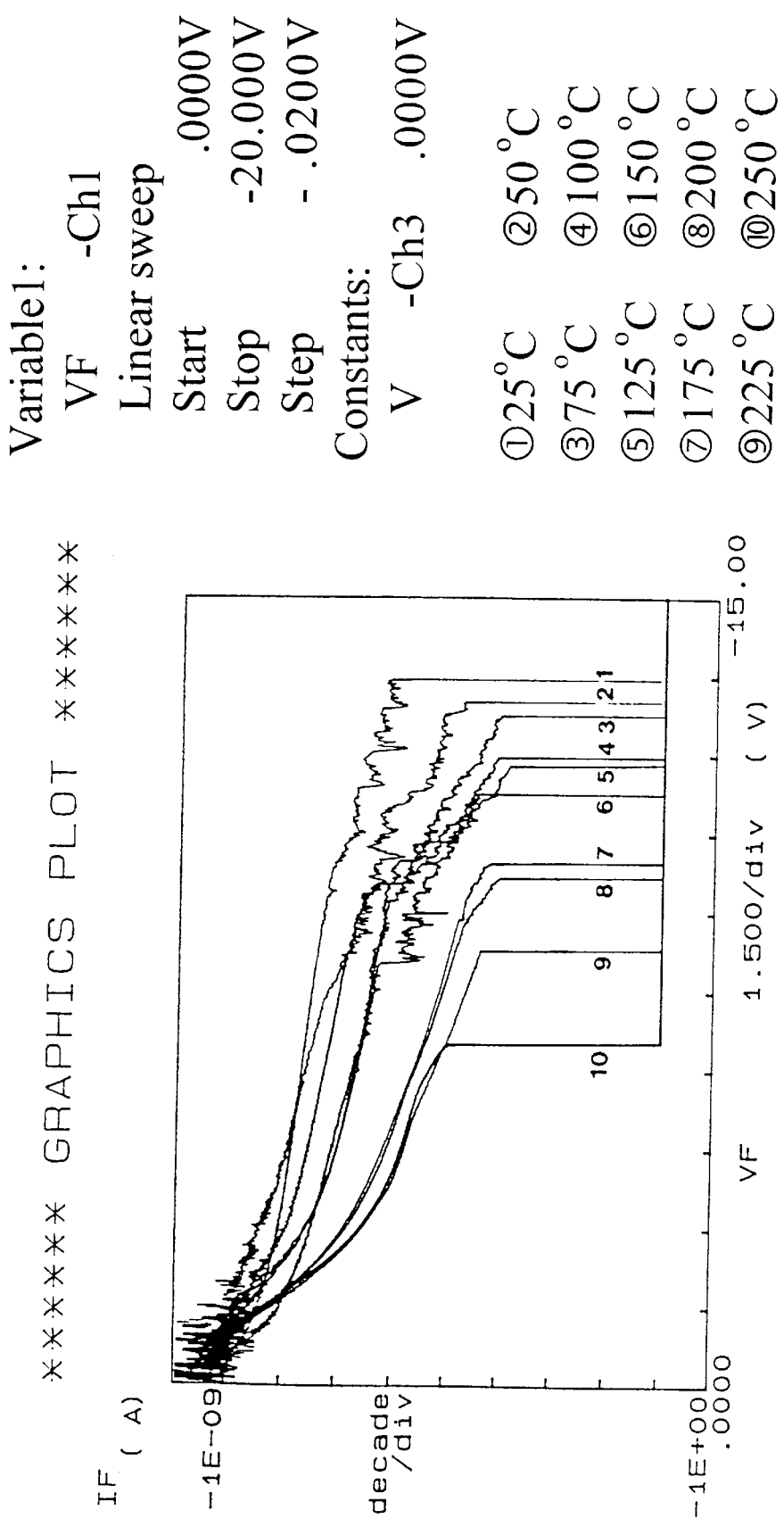
FIG. 6 shows the I/V curves of the antifuse structure measured at various temperatures is as follows: (1) 25° C.; (2) 50° C.; (3) 75 ° C.; (4) 100° C.; (5) 125° C.; (6) 150° C.; (7) 175° C.; (8) 200° C.; (9) 225° C.; and (10) 250° C'.
Figure 7:
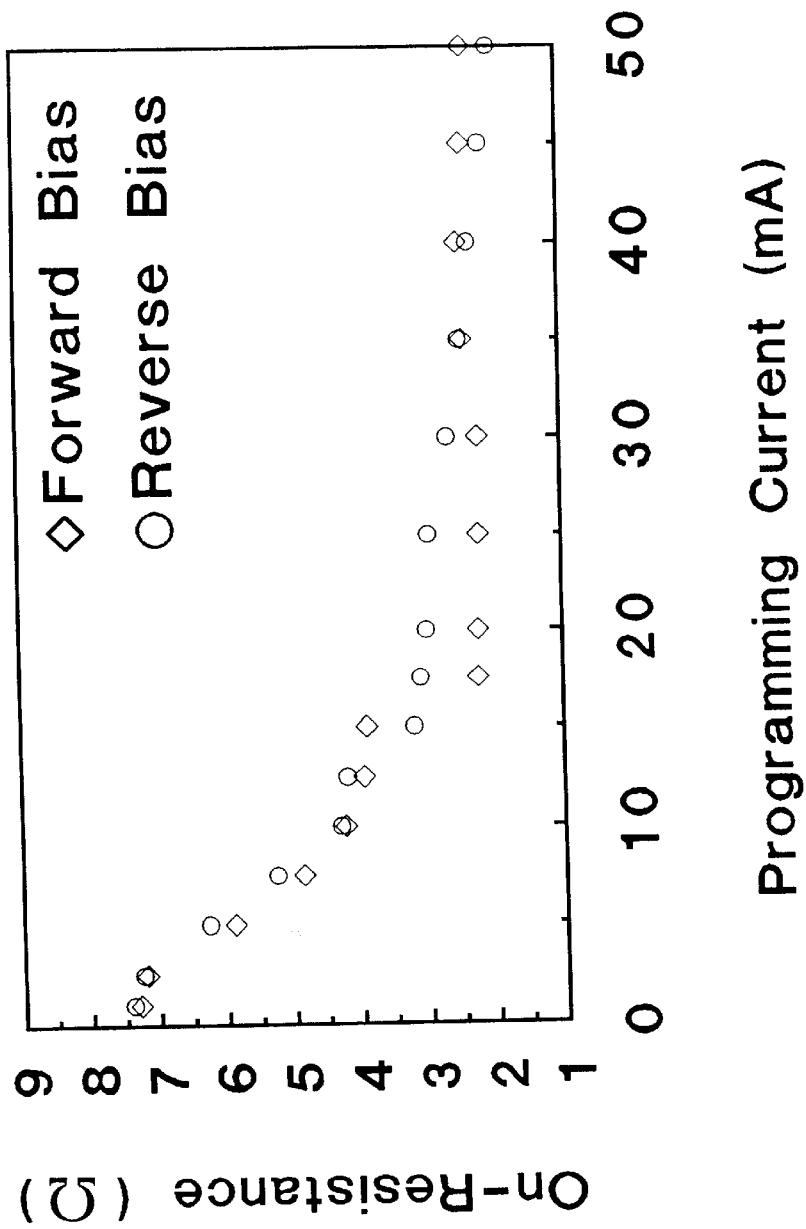
FIG. 7 shows the measured on-resistance of the antifuse structure as a function of the programming current: (1) forward bias and (2) reverse bias.

FIG. 6 illustrates the I/V curves of the antifuse at various temperatures. In general, the thermal emission carrier is increased as the operating temperature increases; it will promote the tunneling current to reach the breakdown current prior to the breakdown. However, the breakdown current of antifuse is independent of the temperature as shown in FIG. 6, but the breakdown voltage is decreased as the operating temperature increases. FIG. 7 illustrates the relation of the programming current to the on-resistance. This figure indicates that a minimum programming current for complete formation of the Al/Si eutectic alloy is 20 mA under which the lowest resistance can be achieved.

Figure 8:
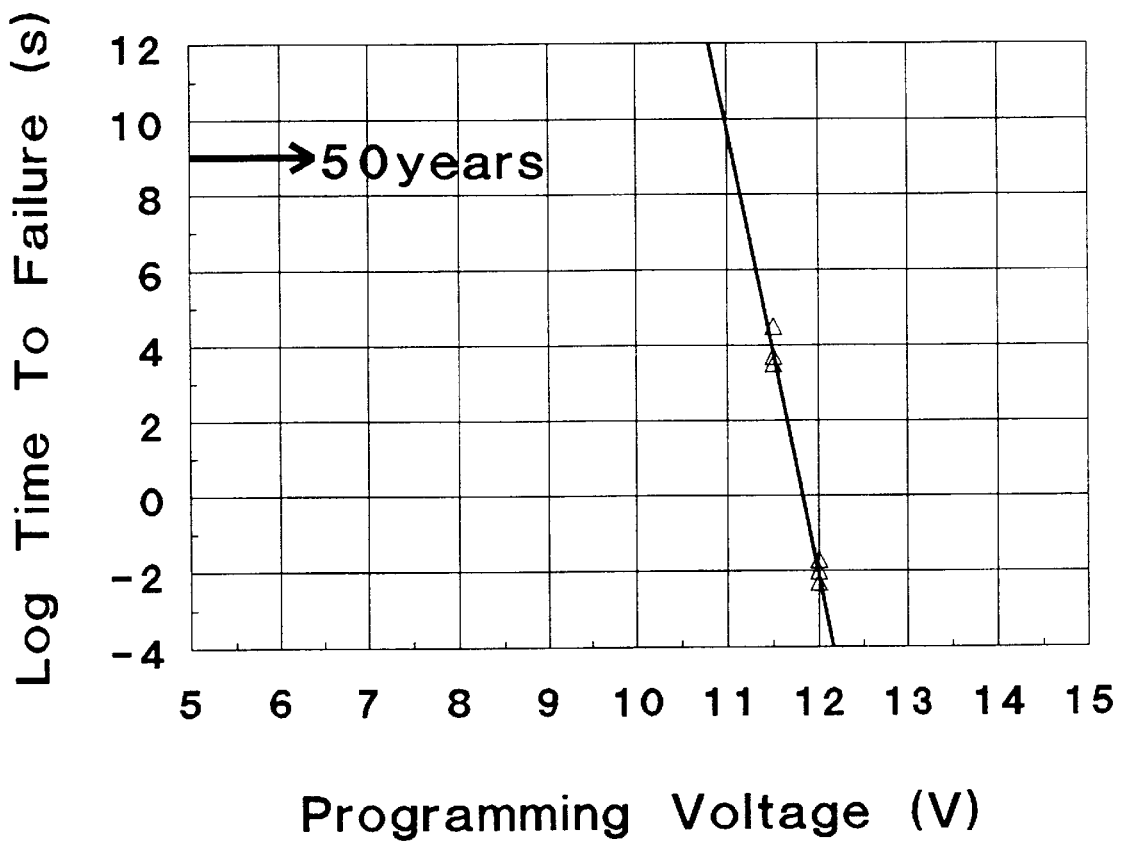
FIG. 8 shows results for the time-dependent dielectric breakdown (TDDB) parameter.

In order to study the durability of this antifuse structure under the OFF state, a 12 V and 11.5 V DC bias are used separately for measuring the time consumed in the breakdown. As shown in FIG. 8, the extrapolation of line in this figure indicates that the lifetime of an unprogrammed antifuse under a stress of the normal operation bias voltage (5V) will exceed 50 years, suggesting that the use time of the antifuse structure can reach over 50 years.

In summarizing the descriptions listed above, the main features of the antifuse structure provided by the invention is to improve the defects generally encountered in the preparation of dielectric materials such as the preparation operates at a high temperature, a high on-resistance (>50 Ω) and an insufficiently concentrated distribution as well as lacking a mechnism allowing separete adjustment of the forward and reverse breakdown voltage. These features illustrate the originality and practicability of the invention.

What is claimed:

1. A voltage-programmable, low on-resistance antifuse structure comprises at least a substrate, an oxide layer, an Al layer, an i-a-SiC:H as a barrier enhancement layer having a thickness of 50–100 A and an i-a-Si:H material as an insulation layer of 1000–2000 A.

2. A low on-resistance antifuse structure of claim 1 wherein any of the substrate, the oxide layer, the Al layer, the barrier enhancement layer and the insulation layer can be varied in layer numbers and sequential arrangements in the antifuse structure.

3. A low on-resistance antifuse structure of claim 1 wherein the substrate, the oxide layer, the Al layer, the barrier enhancement layer and the insulation layer is preferrably arranged in the antifuse structure from top to bottom in a sequential order as follows: the first Al layer—the first barrier enhancement layer—the insulation layer—the second barrier enhancement layer—the second Al layer—the oxide layer and the substrate.

4. A voltage-programmable, low on-resistance antifuse structure of claim 1 wherein a $SiO_2$ material is used as the oxide layer.

5. A voltage-programmable, low on-resistance antifuse structure of claim 1 wherein the barrier enhancement layer can be substituted by an i-a-$Si_3N_4$:H.

6. A low on-resistance antifuse structure of claim 1 wherein the substrate can be selected from an undoped intrinsic silicon wafer, a n-type silicon wafer or a p-type silicon wafer.

* * * * *